(12) United States Patent
Cui et al.

(10) Patent No.: US 12,225,150 B2
(45) Date of Patent: Feb. 11, 2025

(54) DISPLAY APPARATUS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Zhihong Cui, Beijing (CN); Binfeng Feng, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 315 days.

(21) Appl. No.: 17/912,916

(22) PCT Filed: Sep. 10, 2021

(86) PCT No.: PCT/CN2021/117606
§ 371 (c)(1),
(2) Date: Sep. 20, 2022

(87) PCT Pub. No.: WO2022/089038
PCT Pub. Date: May 5, 2022

(65) Prior Publication Data
US 2023/0080404 A1 Mar. 16, 2023

(30) Foreign Application Priority Data

Oct. 30, 2020 (CN) .......................... 202022471608.6

(51) Int. Cl.
*H04M 1/00* (2006.01)
*H04M 1/02* (2006.01)
(Continued)

(52) U.S. Cl.
CPC .......... *H04M 1/0266* (2013.01); *H05K 1/147* (2013.01); *H05K 7/20963* (2013.01)

(58) Field of Classification Search
CPC .. H04M 1/0266; H05K 1/147; H05K 7/20963
(Continued)

(56) References Cited

U.S. PATENT DOCUMENTS 8,829,508 B2   9/2014   Park
10,048,786 B2   8/2018   Ahn et al.
(Continued)

FOREIGN PATENT DOCUMENTS

CN          102548257 A       7/2012
CN          202551490 U       11/2012
(Continued)

OTHER PUBLICATIONS

Written Opinion from PCT/CN2021/117606 dated Nov. 9, 2021.
International Search Report from PCT/CN2021/117606 dated Nov. 9, 2021.

*Primary Examiner* — Zhengfu J Feng
(74) *Attorney, Agent, or Firm* — Calfee, Halter & Griswold LLP (57) ABSTRACT

A display apparatus, comprising a first display panel, a first flexible circuit board, and a rigid membrane, wherein the first flexible circuit board is arranged on the back side of the first display panel; the first flexible circuit board comprises a first portion, a second portion, and a bending portion for connecting the first portion and the second portion; the first portion is electrically connected to the first display panel, and the second portion is located on the side of the first portion away from the first display panel; and the rigid membrane is located between the back side of the first display panel (101) and the bending portion, the rigid membrane supports the bending portion, the rigidity of the rigid membrane is greater than the rigidity of the first display (Continued)

panel (101), and the rigid membrane is used for dispersing a resilience force generated by the bending portion.

20 Claims, 3 Drawing Sheets

(51) Int. Cl.
*H05K 1/14* (2006.01)
*H05K 7/20* (2006.01)

(58) Field of Classification Search
USPC .......................................................... 361/807
See application file for complete search history.

(56) References Cited

U.S. PATENT DOCUMENTS

| | | | |
|---|---|---|---|
| 2014/0048778 A1 | 2/2014 | Park | |
| 2016/0266690 A1* | 9/2016 | Ahn | G06F 1/1637 |
| 2018/0013191 A1* | 1/2018 | Cameron | H01Q 1/42 |
| 2019/0014671 A1* | 1/2019 | Ahn | H05K 1/028 |
| 2019/0116405 A1* | 4/2019 | Noh | G06F 1/1626 |
| 2020/0022261 A1* | 1/2020 | Choi | H10K 59/8722 |
| 2020/0057472 A1* | 2/2020 | Kang | G06F 1/1601 |

FOREIGN PATENT DOCUMENTS

| | | |
|---|---|---|
| CN | 105976701 A | 9/2016 |
| CN | 206057755 U | 3/2017 |
| CN | 207184925 U | 4/2018 |
| CN | 208540242 U | 2/2019 |
| CN | 209103327 U | 7/2019 |
| CN | 111292622 A | 6/2020 |
| CN | 213150200 U | 5/2021 |
| CN | 213150201 U | 5/2021 |
| EP | 3070572 A1 | 9/2016 |
| JP | 2001305979 A | 11/2001 |
| JP | 3764945 B2 | 4/2006 |
| KR | 20010098724 A | 11/2001 |
| KR | 100407291 B1 | 11/2003 |
| TW | I287159 B | 9/2007 |

* cited by examiner

DISPLAY APPARATUS

CROSS REFERENCE

The present disclosure is based upon International Application No. PCT/CN2021/117606, filed on Sep. 10, 2021, which is based upon and claims priority to Chinese Patent Application No. 202022471608.6, filed on Oct. 30, 2020, entitled "DISPLAY APPARATUS", the entire contents of which are incorporated herein by reference in its entirety.

TECHNICAL FIELD

The present disclosure relates to the field of display technology, and in particular, to a display apparatus.

BACKGROUND

At present, foldable display products (such as foldable mobile phones) are rapidly rising, and in-folding display products are usually equipped with a secondary display panel as one of the usage scenarios. Due to the structural design limitations of folding display products, when the secondary display panel is installed, the Flexible Printed Circuit (FPC) needs to be bent over for installation, but the bending part of the FPC will rebound and squeeze the secondary display panel, which makes the secondary display prone to generating backlog press marks and affects the display effect.

It should be noted that the information disclosed in the above Background section is only for enhancement of understanding of the background of the present disclosure, and therefore may contain information that does not form the prior art that is already known to a person of ordinary skill in the art.

SUMMARY

The present disclosure provides a display apparatus.

The present disclosure provides a display apparatus, including:
- a first display panel;
- a first flexible circuit board, provided on a back side of the first display panel, wherein the first flexible circuit board includes a first part, a second part and a bending part connecting the first part and the second part, the first part is electrically connected to the first display panel, and the second part is located on a side of the first part away from the first display panel; and
- a rigid membrane, located between the back side of the first display panel and the bending part, wherein the rigid membrane supports the bending part, and a rigidity of the rigid membrane is greater than that of the first display panel, the rigid membrane is used to disperse a resilience force generated by the bending part.

In an exemplary embodiment of the present disclosure, a bending axis corresponding to the bending part extends in a first direction, and an orthographic projection of the bending part on the first display panel has a first boundary and a second boundary opposite in a second direction, the second direction is perpendicular to the first direction;

an orthographic projection of the rigid membrane on the first display panel has a third boundary and a fourth boundary opposite in the second direction, the third boundary is located at a side of the first boundary away from the second boundary, and the fourth boundary is located at a side of the second boundary away from the first boundary.

In an exemplary embodiment of the present disclosure, a distance between the third boundary and the first boundary in the second direction is equal to a distance between the fourth boundary and the second boundary in the second direction.

In an exemplary embodiment of the present disclosure, a distance between the third boundary and the first boundary in the second direction is greater than or equal to 1 cm, a distance between the fourth boundary and the second boundary in the second direction is greater than or equal to 1 cm.

In an exemplary embodiment of the present disclosure, a buffer part is provided in a bending space of the bending part, and an orthographic projection of the buffer part on the first display panel is located in an orthographic projection of the rigid membrane on the first display panel.

In an exemplary embodiment of the present disclosure, the buffer part is provided on a position of the bending part close to the first part, and the orthographic projection of the buffer part on the first display panel is located in a central area of the orthographic projection of the rigid membrane on the first display panel.

In an exemplary embodiment of the present disclosure, the rigid membrane has a thickness of 0.1 mm to 0.5 mm.

In an exemplary embodiment of the present disclosure, a material of the rigid membrane is polyimide or stainless steel.

In an exemplary embodiment of the present disclosure, the display apparatus further includes a first heat dissipation film layer, provided on the back side of the first display panel, and located on a side of the rigid membrane close to the first display panel, wherein, the rigidity of the rigid membrane is greater than that of the first heat dissipation film layer.

In an exemplary embodiment of the present disclosure, an orthographic projection of the first heat dissipation film layer on the first display panel is located in the first display panel or coincides with the first display panel;

an orthographic projection of the rigid membrane on the first display panel is located in the orthographic projection of the first heat dissipation film layer on the first display panel.

In an exemplary embodiment of the present disclosure, the display apparatus further includes:
- a first middle frame, including a first mounting plate and a first side plate, wherein the first mounting plate has a first mounting surface and a second mounting surface opposite to each other, the first side plate is arranged at periphery of the first mounting surface and forms a first mounting groove with the first mounting surface, wherein the first display panel, the first flexible circuit board and the rigid membrane are located in the first mounting groove, and the first part is located on a side of the second part away from the first mounting surface;
- a first main circuit board, provided on the first mounting surface, wherein a first connection terminal is provided on the first main circuit board, and the first connection terminal is electrically connected to the second part;
- a first cover plate, provided on a display side of the first display panel, wherein an edge of the first cover plate is beyond an edge of the first display panel, and a part of the first cover plate beyond the first display panel is overlapped on an end surface of the first side plate away from the first mounting surface.

In an exemplary embodiment of the present disclosure, the first mounting surface is provided with an escape groove corresponding to the bending part, and a first assembly groove is provided on the first mounting surface, wherein the first main circuit board is located in the first assembly groove, and a part of the first connection terminal extends out of the first assembly groove and is electrically connected with the second part.

In an exemplary embodiment of the present disclosure, the display apparatus further includes:
- a second middle frame, rotatably connected with the first middle frame, wherein the second middle frame at least includes a second mounting plate, and the second mounting plate has a third mounting surface and a fourth mounting surface opposite to each other;
- a second display panel, located on a side of the second mounting surface away from the first mounting surface and located on a side of the third mounting surface away from the fourth mounting surface,
- wherein, relative rotation of the first middle frame and the second middle frame enables the third mounting surface to rotate to a position facing the second mounting surface, and the second display panel is able to bend at the same time.

In an exemplary embodiment of the present disclosure, the display apparatus further includes:
- a second main circuit board, provided on the first mounting board or the second mounting board, wherein a second connection terminal is provided on the second main circuit board;
- a second flexible circuit board, having one end electrically connected to the second connection terminal, and another end electrically connected to the second display panel;
- a second cover plate, provided on a side of the second display panel away from the second mounting surface and the third mounting surface, wherein the second cover plate is able to bend.

In an exemplary embodiment of the present disclosure, the first mounting surface is further provided with a second assembly groove, the first mounting plate is further provided with a through hole penetrating the first mounting surface and the second mounting surface, and the through hole communicates with the second assembly groove;
the second main circuit board and the second connection terminal are located in the second assembly groove, and one end of the second flexible circuit board is electrically connected to the second connection terminal through the through hole,
wherein the second main circuit board and the first main circuit board have an integrated structure or are provided independently of each other.

It should be noted that the above general description and the following detailed description are merely exemplary and exemplary and should not be construed as limiting of the present disclosure.

BRIEF DESCRIPTION OF THE DRAWINGS

The accompanying drawings, which are incorporated in and constitute a part of this specification, illustrate embodiments consistent with the disclosure and serve to explain the principles of the disclosure together with the description. The drawings in the following description are only some embodiments of the present disclosure, and for those of ordinary skill in the art, other drawings can also be obtained from these drawings without creative effort.

DETAILED DESCRIPTION

In order to make the objectives, technical solutions and advantages of the present disclosure clearer, the embodiments of the present disclosure will be described in detail below with reference to the accompanying drawings. Note that embodiments may be implemented in many different forms. Those skilled in the art can easily understand the fact that the manner and content can be changed into various forms without departing from the spirit and scope of the present disclosure. Therefore, the present disclosure should not be construed as being limited only to the contents described in the following embodiments. The embodiments of the present disclosure and the features of the embodiments may be arbitrarily combined with each other without conflict.

In the drawings, the size of each constituent element, the thickness of a layer, or a region are exaggerated sometimes for clarity. Therefore, one form of the present disclosure is not necessarily limited to this size, and the shapes and sizes of various components in the drawings do not reflect the true scale. In addition, the drawings schematically show ideal examples, and one form of the present disclosure is not limited to the shapes, numerical values, and the like shown in the drawings.

It should be noted that "on" described in this text can mean that one layer is directly formed or disposed on another layer, or it can mean that one layer is indirectly formed or disposed on another layer, that is, other layers exist between two layers.

The terms "a", "the", "said" are used to indicate the presence of one or more elements/components/etc.; the term "including" is used to indicate an open-ended inclusive meaning and refers to that there may be additional elements/components/etc. in addition to listed elements /components/etc.

In this specification, ordinal numbers such as "first" and "second" are provided to avoid confusion of constituent elements, and are not intended to be limited in quantity.

In this specification, unless expressly stated and defined, the term "connected" should be construed in a broad sense. For example, it may be a fixed connection, or a detachable connection, or an integral connection. It may be a mechanical connection, or an electrical connection. It may be a direct connection, or an indirect connection through an intermediate element, or an internal communication between two elements. For those of ordinary skill in the art, the specific meanings of the above terms in the present disclosure can be understood depending on specific situations.

Figure 1:
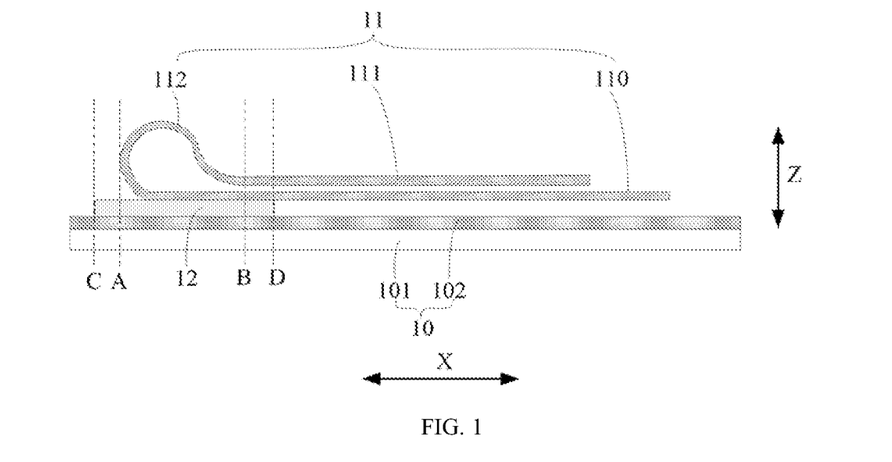
FIGS. 1 to 5 respectively show schematic structural diagrams of the display apparatus according to different embodiments of the present disclosure.

An embodiment of the present disclosure provides a display apparatus, which can be a foldable product, but not limited to this. The display apparatus can also be a non-folding product. Specifically, as shown in FIG. 1, the display apparatus can include a first display module 10, a first flexible circuit board 11 and a rigid membrane 12.

The first display module 10 may be a flexible display module. Optionally, the first display module 10 may include a first display panel 101 and a first heat dissipation film layer 102. The first display panel 101 may be an OLED (Organic Light-Emitting Diode) display. It should be noted that the first display panel 101 may have a display side and a back side opposite to each other in the thickness direction Z. The first heat dissipation film layer 102 may be disposed on the back side of the first display panel 101. The orthographic projection of the first heat dissipation film layer 102 on the first display panel 101 is located in the first display panel 101 or coincides with the first display panel 101.

In the embodiment of the present disclosure, the heat generated by the first display panel 101 can be quickly dissipated by the first heat dissipation film layer 102, to avoid damage to the first display panel 101 due to excessively high temperature.

For example, the first heat dissipation film layer 102 may be a multi-layer structure. The first heat dissipation film layer 102 may include an EMBO (embossed silicone buffer material) layer, a Foam (foam material) layer, a PI (polyamide) layer, a Cu (copper) foil layer and a wave absorbing material layer which are arranged in sequence, but not limited to this. The first heat dissipation film layer 102 can also be composed of other film layers, as long as it can ensure that the first heat dissipation film layer 102 has good heat dissipation performance and bendable performance. In addition, the first heat dissipation film layer 102 may also have a single layer structure, depending on the specific situation.

Figure 2:
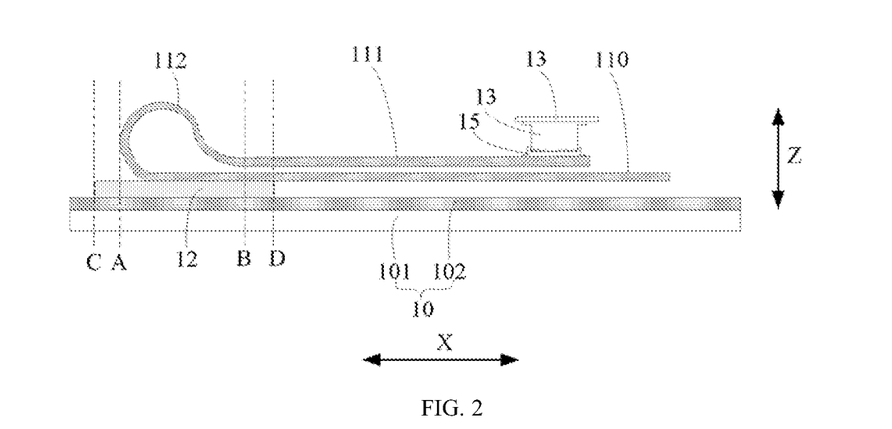

The first flexible circuit board 11 can be disposed on the back side of the first display panel 101. Specifically, the first flexible circuit board 11 can be disposed on the side of the first heat dissipation film layer 102 away from the first display panel 101. As shown in FIG. 1, the first flexible circuit board 11 may include a first part 110, a second part 111, and a bending part 112 connecting the first part 110 and the second part 111. Specifically, the orthographic projection of the bending part 112 on the first display panel 101 may be located in the display area of the first display panel 101. The first part 110 can be electrically connected to the first display panel 101. The second part 111 can be located on the side of the first part 110 away from the first display panel 101. It should be understood that, as shown in FIG. 2, the display apparatus of the embodiment of the present disclosure may further include a first main circuit board 13. The second part 111 may be electrically connected to the first main circuit board 13. It should be noted that the first main circuit board 13 may be located on a side of second part 111 away from the first part 110.

As shown in FIG. 1 and FIG. 2, the rigid membrane 12 may be located between the back side of the first display panel 101 and the bending part 112. Specifically, the rigid membrane 12 can be disposed on the side of the first heat dissipation film layer 102 away from the first display panel 101. The orthographic projection of the rigid membrane 12 on the first display panel 101 can be located in the orthographic projection of the first heat dissipation film 102 on the first display panel 101. The rigid membrane 12 can support the bending part 112 of the first flexible circuit board 11. It should be understood that the rigidity of the rigid membrane 12 may be greater than the rigidity of the first heat dissipation film 102 and the first display panel 101. That is, compared with the first display panel 101 and the first heat dissipation film layer 102, the rigid membrane 12 is less likely to be deformed by the force. For example, the material of the rigid membrane 12 can be polyimide (PI) or stainless steel (SUS). It should be understood that the PI material used for fabricating the rigid membrane 12 should be a hard PI material.

In addition, the thickness of the rigid membrane 12 may be 0.1 mm to 0.5 mm, for example, 0.1 mm, 0.2 mm, 0.3 mm, 0.4 mm, 0.5 mm, etc. By designing the thickness of the rigid membrane 12 to be greater than or equal to 0.1 mm, it can ensure that the rigid membrane 12 has sufficient rigidity. By designing the thickness of the rigid membrane 12 to be less than or equal to 0.5 mm, it can reduce the overall thickness of the product.

In the embodiment of the present disclosure, since the rigid membrane 12 is disposed between the bending part 112 of the first flexible circuit board 11 and the back side of the first display panel 101, and the rigid membrane 12 is less likely to be deformed by the force, during the installation process, the rigid membrane 12 can disperse the resilient force generated by the bending part 112. In this way, it can avoid generating obvious press marks at the position corresponding to the bending part 112 in the display area of the first display panel 101, and improve the display effect.

It should be noted that, the bending part 112 of the first flexible circuit board 11 in the embodiment of the present disclosure is not limited to be provided in the display area of the first display panel 101. The bending part 112 of the first flexible circuit board 11 may also be provided in a non-display area.

The installation process of aforementioned structures may be as follows: first, the second part 111 of the first flexible circuit board 11 is electrically connected to the first main circuit board 13, and then the first flexible circuit board 11 is bent, to form the aforementioned bending part 112, and the first part 110 is made to be located on the side of the second part 111 away from the first main circuit board 13. It should be noted that the first part 110 can be electrically connected to the first display panel 101 before the second part 111 is electrically connected to the first main circuit board 13, or the first part 110 can be electrically connected to the first display panel 101 when the first part 110 is bent to the side of the second part 111 away from the first main circuit board 13.

For example, a part of the first display panel 101 can be bent to the back side (not shown in the figure) and bound with the first part 110 of the first flexible circuit board 11, to realize the electrical connection of the first display panel 101 and the first part 110. As shown in FIG. 2, the first main circuit board 13 may be provided with a first connection terminal 14, and the second part 111 of the first flexible circuit board 11 may be provided with a mating terminal 15 that can be buckled or inserted with the first connection terminal 14. That is, the electrical connection of the first main circuit board 13 and the second part 111 is realized by the mating terminal 15 being buckled or inserted with the first connection terminal 14.

In the embodiment of the present disclosure, the bending axis corresponding to the bending part 112 of the first flexible circuit board 11 may extend in a first direction (not shown in the figure), and the orthographic projection of the bending part 112 on the first display panel 101 has a first boundary A and a second boundary B opposite to each other in the second direction X. It should be noted that the second boundary B is the side of the bending part 112 close to the first part 110 and the second part 111, the first boundary A is the side of the bending part 112 away from the first part 110 and the second part 111, as shown in FIGS. 1 and 2. The orthographic projection of the rigid membrane 12 on the first display panel 101 has a third boundary C and a fourth boundary D opposite to each other in the second direction X. As shown in FIG. 1 and FIG. 2, the third boundary C is located at a side of the first boundary A away from the second boundary B, and the fourth boundary D is located at a side of the second boundary B away from the first boundary A.

In this embodiment, by locating the first boundary A and the second boundary B of the bending part 112 at the inner side of the third boundary C and the fourth boundary D of the rigid membrane 12, the rigid membrane 12 can better disperse the resilient force generated by the bending part 112. Specifically, compared with the solution in which the first boundary A and the second boundary B of the bending part 112 are located outside the third boundary C and the fourth boundary D of the rigid membrane 12, it can avoid the resilient force generated by the bending part 112 concentrated on the third boundary C and the fourth boundary D of the rigid membrane 12, thus avoiding generating press marks at positions corresponding to the third boundary C and the fourth boundary D of rigid membrane 12 in the first display panel 101, and improving the display effect.

It should be noted that the second direction X mentioned in the embodiment of the present disclosure is perpendicular to the first direction (not shown in the figure). Both the first direction and the second direction X are perpendicular to the thickness direction Z (i.e., the thickness direction Z of the display apparatus) of the first display panel 101.

Optionally, the distance between the third boundary C of the rigid membrane 12 and the first boundary A of the bending part 112 in the second direction X may be equal to the distance between the fourth boundary D of the rigid membrane 12 and the second boundary B of the bending part 112 in the second direction X, which can ensure the uniformity of the overall force of the rigid membrane 12, so as to better disperse the stress, but not limited to this. The distance between the third boundary C of the rigid membrane 12 and the first boundary A of the bending part 112 in the second direction X may also be unequal to the distance between the fourth boundary D of the rigid membrane 12 and the second boundary B of the bending part 112 in the second direction X.

In the embodiment of the present disclosure, the distance between the third boundary C of the rigid membrane 12 and the first boundary A of the bending part 112 in the second direction X may be greater than or equal to 1 cm, and the distance between the fourth boundary D of the rigid membrane 12 and the second boundary B of the bending part 112 in the second direction X may be greater than or equal to 1 cm. This design enables the rigid membrane 12 to better disperse the stress.

It should be noted that, the area of the rigid membrane 12 in the embodiment of the present disclosure can be determined according to actual situations, as long as it can better disperse the stress to avoid the installation press marks.

Figure 3:
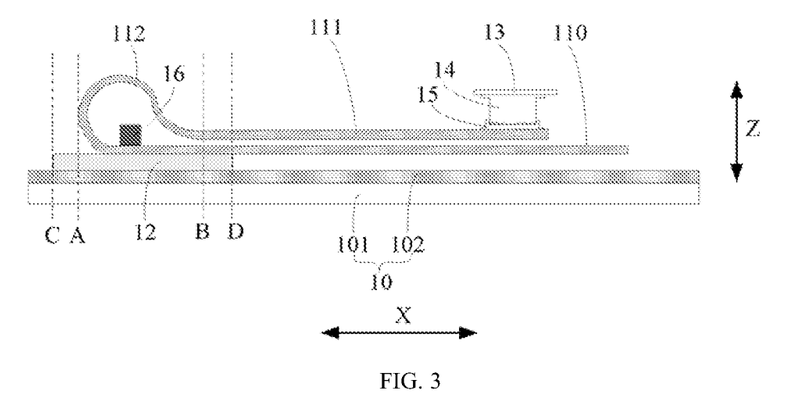

In some embodiments of the present disclosure, as shown in FIG. 3, a buffer part 16 may be disposed in the bending space of the bending part 112, and the orthographic projection of the buffer part 16 on the first display panel 101 is located in the orthographic projection of the rigid membrane 12 on the first display panel 101. Specifically, the buffer part 16 may be disposed on a position of the bending part 112 close to the first part 110, and the orthographic projection of the buffer part 16 on the first display panel 101 is located in the central area of the orthographic projection of the rigid membrane 12 on the first display panel 101.

In this embodiment, by disposing the buffer part 16 in the bending space of the bending part 112, the design enables the buffer part 16 to provide a certain buffer force for the bending part 112, to ensure that the bending part 112 has good ability to recover deformation, and to avoid the situation that the bending part 112 forms a dead break during the installation process.

Figure 4:
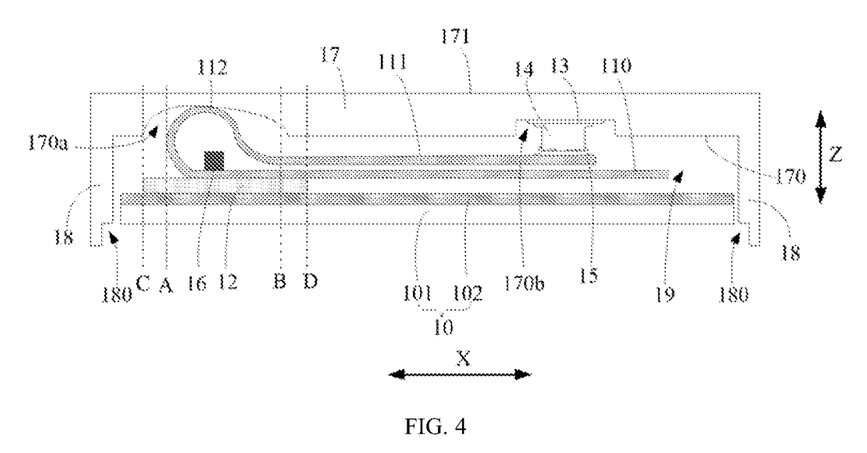

It should be understood that the display apparatus of the embodiment of the present disclosure is not limited to include the aforementioned first display panel 101, the first heat dissipation film layer 102, the first flexible circuit board 11, the first main circuit board 13, the rigid membrane 12, the buffer part 16 and other structures. In addition to these structures, the display apparatus can also include a middle frame structure. The middle frame structure includes at least a first middle frame. Specifically, as shown in FIG. 4, the first middle frame may include a first mounting plate 17 and the first side plate 18. The first mounting plate 17 has the first mounting surface 170 and the second mounting surface 171 opposite to each other. The first side plate 18 is arranged at periphery of the first mounting surface 170 and forms a first mounting groove 19 with the first mounting surface 170. It should be noted that when the first mounting surface 170 is rectangular, the first side plate 18 can be arranged around four sides of the first mounting surface 170, but not limited to this. The first side plate 18 can also be arranged around three sides of the first mounting surface 170, or arranged at opposite two sides of the first mounting surface 170, or the like, depending on the specific situation.

The first display panel 101, the first heat dissipation film layer 102, the first flexible circuit board 11 and the rigid membrane 12 mentioned above can be located in the first mounting groove 19, and the first part 110 is located on a side of the second part 111 away from the first mounting surface 170. It should be noted that, as shown in FIG. 4, the first mounting surface 170 may be provided with an escape groove 170a corresponding to the bending part 112, and the first mounting surface 170 is provided with a first assembly groove 170b. The aforementioned first main circuit board 13 can be located in the first assembly groove 170b, and a part of the first connection terminal 14 extends out of the first assembly groove 170b and is electrically connected to the second part 111.

Figure 5:
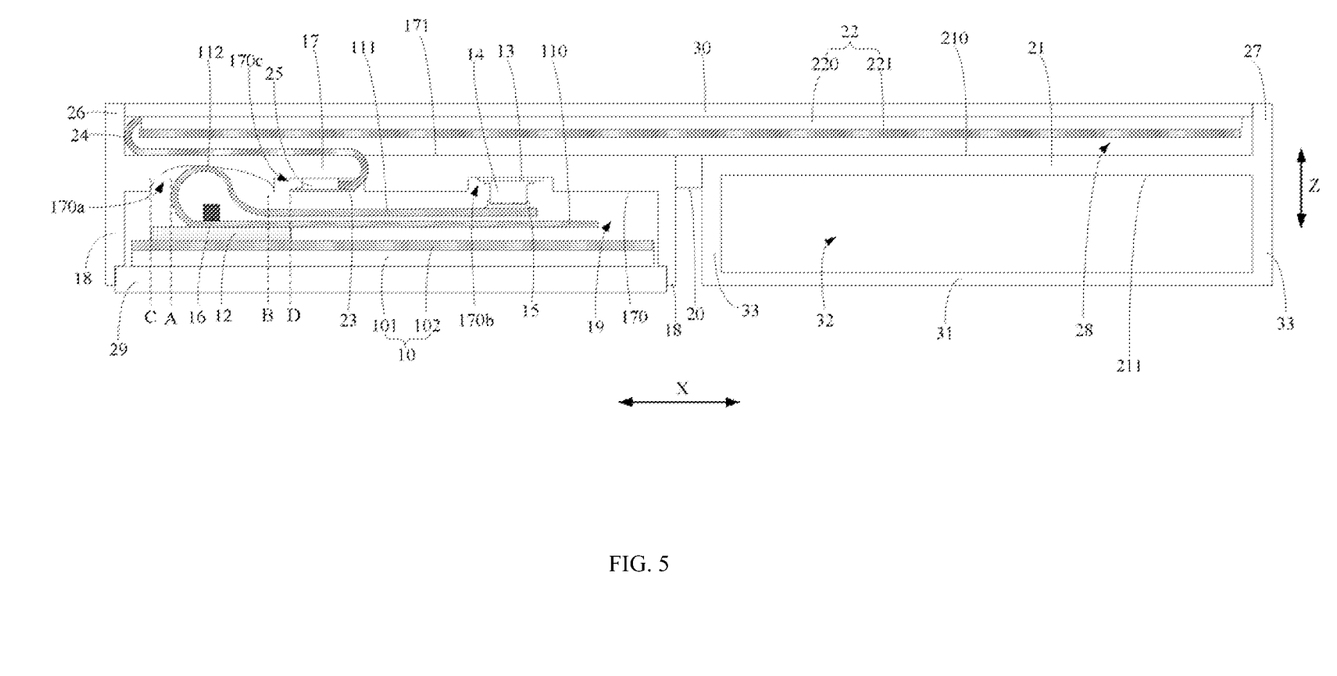

In the embodiment of the present disclosure, the middle frame structure may be a folding mechanism. In addition to the first middle frame, the middle frame structure may further include a second middle frame rotatably connected to the first middle frame. As shown in FIG. 5, the second middle frame may be rotatably connected to the first middle frame through the rotating shaft 20. The second middle frame can at least include a second mounting plate 21. The second mounting plate 21 has a third mounting surface 210 and a fourth mounting surface 211 opposite to each other. The relative rotation of the first middle frame and the second middle frame can make the third mounting surface 210 rotate to a position facing the second mounting surface 171.

Optionally, as shown in FIG. 5, the display apparatus according to the embodiment of the present disclosure may further include a second display module 22. Specifically, the second display module 22 may include a second display panel 220 and a second heat dissipation film layer 221. The second display panel 220 can be located on the side of the second mounting surface 171 away from the first mounting surface 170 and located on the side of the third mounting surface 210 away from the fourth mounting surface 211. The second heat dissipation film layer 221 is located on the side of the second mounting surface 171 away from the first mounting surface 170 and located on the side of the third mounting surface 210 away from the fourth mounting surface 211, and is provided on the back side of the second display panel 220. The orthographic projection of the second heat dissipation film layer 221 on the second display panel 220 is located in the second display panel 220 or coincides with the second display panel 220.

In addition, the structures of the second heat dissipation film layer 221 and the aforementioned first heat dissipation film layer 102 may be the same, and details are not repeated herein.

The second display panel 220 may be an OLED display, and the second display module 22 may be a flexible display panel. When the first middle frame and the second middle frame are relatively rotated so that the third mounting surface 210 is rotated to a position facing the second mounting surface 171, the second display module 22 can be bent. That is, the entire display apparatus can be bent inward. That is, the display surface of the second display panel 220 is located inside the bending.

In an embodiment of the present disclosure, as shown in FIG. 5, the display apparatus may further include a second main circuit board 23 and a second flexible circuit board 24. The second main circuit board 23 may be disposed on the first mounting board 17 or the second mounting board 21. The second main circuit board 23 is provided with a second connection terminal. One end of the second flexible circuit board 24 is electrically connected to the second connection terminal 25, and the other end of the second flexible circuit board 24 is electrically connected to the second display panel 220.

For example, as shown in FIG. 5, the aforementioned first mounting surface 170 may further be provided with a second assembly groove 170c, and the first mounting plate 17 is also provided with a through hole (not shown in the figure) penetrating the first mounting surface 170 and the second mounting surface 171. The through hole communicates with the second assembly groove 170c. The second main circuit board 23 and the second connection terminal 25 are located in the second assembly groove 170c, and one end of the second flexible circuit board 24 is electrically connected to the second connection terminal 25 through the through hole.

It should be noted that the second main circuit board 23 and the first main circuit board 13 can be in an integrated structure or can be provided independently of each other. It should be understood that when the second main circuit board 23 and the first main circuit board 13 are in an integrated structure, the first assembly groove 170b and the second assembly groove 170c can communicate with each other.

In the embodiment of the present disclosure, as shown in FIG. 5, the second side plate 26 may be provided around the second mounting surface 171 of the first mounting plate 17. It should be understood that one side of the second mounting surface 171 adjacent to the third mounting surface 210 may not be provided with the second side plate 26, and the other three sides may be provided with the second side plate 26, but not limited to this. The third side plate 27 may be provided around the third mounting surface 210 of the second mounting plate 21. It should be understood that a side of the third mounting surface 210 adjacent to the second mounting surface 171 may not be provided with the third side plate 27, and the other three sides can be provided with the third side plate 27, but not limited to this. The second side plate 26, the second mounting surface 171, the third mounting surface 210 and the third side plate 27 can enclose the second mounting groove 28. The second display module 22, the second flexible circuit board 24 aforementioned can be located in the second mounting groove 28.

In addition, as shown in FIG. 5, the display apparatus of the embodiment of the present disclosure may further include a first cover plate 29 and a second cover plate 30. The first cover plate 29 may be disposed on the display side of the first display panel 101. An edge of the first cover plate 29 is beyond an edge of the first display panel 101, and a part of the first cover plate 29 beyond the first display panel 101 is overlapped on an end surface of the first side plate 18 away from the first mounting surface 170. For example, the end surface of the first side plate 18 away from the first mounting surface 170 may be provided with a positioning groove 180, as shown in FIG. 4, the part of the first cover plate 29 beyond the first display panel 101 is overlapped in the positioning groove 180, as shown in FIG. 5, but not limited thereto. The second cover plate 30 can be disposed on the side (i.e., the display side of the second display panel 220) of the second display panel 220 away from the second mounting surface 171 and the third mounting surface 210, the edge of the second cover plate 30 can also extend beyond the edge of the second display panel 220. For example, the second cover plate 30 can be embedded in the second mounting groove 28, and the surface of the second cover plate 30 away from the second display panel 220 may be flush with the end surface of the second side plate 26 away from the first mounting plate 17 and the end surface of the third side plate 27 away from the second mounting plate 21, but not limited thereto.

It should be noted that the second cover 30 can be a flexible cover, such as a PI cover. That is to say, the second cover 30 can be bent. Specifically, when the first middle frame and the second middle frame are relatively rotated so that the third mounting surface 210 is rotated to a position facing the second mounting surface 171, the second cover plate 30 can be bent along with the second display module 22. However, the first cover plate 29 can be a rigid cover plate, such as a glass cover plate, etc. That is, the first cover plate 29 cannot be bent, but not limited to this. The first cover plate 29 can also be a flexible cover board, depending on specific situations.

As shown in FIG. 5, the fourth side plate 33 can also be arranged around the fourth mounting surface 211. It should be noted that when the fourth mounting surface 211 is rectangular, the fourth side plate 33 can be arranged around four sides of the fourth mounting surface 211, but not limited to this. The fourth side plate 33 can also be arranged around three sides of the fourth mounting surface 211, or arranged at opposite two sides of the fourth mounting surface 211, or the like, depending on the specific situation.

In addition, the second middle frame may further include a third mounting plate 31 opposite to the second mounting plate 21. The fourth side plate 33 may enclose a third mounting groove 32 together with the third mounting plate 31 and the fourth mounting surface 211 of the second mounting plate 21. The display apparatus may further include a battery (not shown in the figure) and other structures. The battery can be placed in the third mounting groove 32, but not limited to this. The third mounting groove 32 can also be provided with other structures. It should be noted that, the second middle frame in the embodiment of the present disclosure may also not include the third mounting plate 31, depending on the specific situation.

It should be noted that, the entire first middle frame in the embodiment of the present disclosure may have an integrated structure, and the entire second middle frame may also have an integrated structure.

Based on the foregoing, the first display panel 101 of the embodiment of the present disclosure may be a sub display panel of the entire display apparatus, and the second display panel 220 may be a main display panel of the entire display apparatus. When the display apparatus is in the unfolded state, the second display panel 220 may be used for display, and when the display apparatus is in a folded state, the first display panel 101 may be used for display.

In the embodiments of the present disclosure, the specific type of the display apparatus is not particularly limited, and any type of display apparatus commonly used in the art can be used, such as a mobile phone, etc. Those skilled in the art can make corresponding selection according to the specific use of the display apparatus, which will not be repeated herein.

It should be noted that, in addition to the aforementioned structure, the display apparatus also includes other necessary parts and components. Taking a mobile phone as an example, it may also include, for example, a casing, a power cord, etc. Those skilled in the art can make corresponding supplements according to the specific usage requirements of the display apparatus, which will not be repeated herein.

Other embodiments of the present disclosure will readily occur to those skilled in the art upon consideration of the specification and practice of the disclosure disclosed herein. This disclosure is intended to cover any variations, uses, or adaptations of this disclosure that follow the general principles of this disclosure and include common general knowledge or conventional technical means in the technical field not disclosed by this disclosure. The specification and embodiments are to be regarded as exemplary only, with the true scope and spirit of the disclosure being indicated by the appended claims.

What is claimed is:

1. A display apparatus, comprising:
   a first display panel;
   a first flexible circuit board, provided on a back side of the first display panel, wherein the first flexible circuit board comprises a first part, a second part and a bending part connecting the first part and the second part, the first part is electrically connected to the first display panel, and the second part is located on a side of the first part away from the first display panel; and
   a rigid membrane, located between the back side of the first display panel and the bending part, wherein the rigid membrane supports the bending part, and a rigidity of the rigid membrane is greater than that of the first display panel, the rigid membrane is used to disperse a resilience force generated by the bending part.

2. The display apparatus according to claim 1, wherein a bending axis corresponding to the bending part extends in a first direction, and an orthographic projection of the bending part on the first display panel has a first boundary and a second boundary opposite in a second direction, the second direction is perpendicular to the first direction;
   an orthographic projection of the rigid membrane on the first display panel has a third boundary and a fourth boundary opposite in the second direction, the third boundary is located at a side of the first boundary away from the second boundary, and the fourth boundary is located at a side of the second boundary away from the first boundary.

3. The display apparatus according to claim 2, wherein a distance between the third boundary and the first boundary in the second direction is equal to a distance between the fourth boundary and the second boundary in the second direction.

4. The display apparatus according to claim 2, wherein a distance between the third boundary and the first boundary in the second direction is greater than or equal to 1 cm, a distance between the fourth boundary and the second boundary in the second direction is greater than or equal to 1 cm.

5. The display apparatus according to claim 1, wherein a buffer part is provided in a bending space of the bending part, and an orthographic projection of the buffer part on the first display panel is located in an orthographic projection of the rigid membrane on the first display panel.

6. The display apparatus according to claim 5, wherein the buffer part is provided on a position of the bending part close to the first part, and the orthographic projection of the buffer part on the first display panel is located in a central area of the orthographic projection of the rigid membrane on the first display panel.

7. The display apparatus according to claim 1, wherein the rigid membrane has a thickness of 0.1 mm to 0.5 mm.

8. The display apparatus according to claim 1, wherein a material of the rigid membrane is polyimide or stainless steel.

9. The display apparatus according to claim 1, wherein the display apparatus further comprises a first heat dissipation film layer, provided on the back side of the first display panel, and located on a side of the rigid membrane close to the first display panel,
   wherein, the rigidity of the rigid membrane is greater than that of the first heat dissipation film layer.

10. The display apparatus according to claim 9, wherein
    an orthographic projection of the first heat dissipation film layer on the first display panel is located in the first display panel or coincides with the first display panel;
    an orthographic projection of the rigid membrane on the first display panel is located in the orthographic projection of the first heat dissipation film layer on the first display panel.

11. The display apparatus according to claim 1, further comprising:
    a first middle frame, comprising a first mounting plate and a first side plate, wherein the first mounting plate has a first mounting surface and a second mounting surface opposite to each other, the first side plate is arranged at periphery of the first mounting surface and forms a first mounting groove with the first mounting surface, wherein the first display panel, the first flexible circuit board and the rigid membrane are located in the first mounting groove, and the first part is located on a side of the second part away from the first mounting surface;
    a first main circuit board, provided on the first mounting surface, wherein a first connection terminal is provided on the first main circuit board, and the first connection terminal is electrically connected to the second part;
    a first cover plate, provided on a display side of the first display panel, wherein an edge of the first cover plate is beyond an edge of the first display panel, and a part of the first cover plate beyond the first display panel is overlapped on an end surface of the first side plate away from the first mounting surface.

12. The display apparatus according to claim 11, wherein the first mounting surface is provided with an escape groove corresponding to the bending part, and a first assembly groove is provided on the first mounting surface, wherein the first main circuit board is located in the first assembly groove, and a part of the first connection terminal extends out of the first assembly groove and is electrically connected with the second part.

13. The display apparatus according to claim 12, further comprising:
    a second middle frame, rotatably connected with the first middle frame, wherein the second middle frame at least comprises a second mounting plate, and the second mounting plate has a third mounting surface and a fourth mounting surface opposite to each other;

a second display panel, located on a side of the second mounting surface away from the first mounting surface and located on a side of the third mounting surface away from the fourth mounting surface, wherein, relative rotation of the first middle frame and the second middle frame enables the third mounting surface to rotate to a position facing the second mounting surface, and the second display panel is able to bend at the same time.

14. The display apparatus according to claim 13, further comprising:
    a second main circuit board, provided on the first mounting plate or the second mounting plate, wherein a second connection terminal is provided on the second main circuit board;
    a second flexible circuit board, having one end electrically connected to the second connection terminal, and another end electrically connected to the second display panel;
    a second cover plate, provided on a side of the second display panel away from the second mounting surface and the third mounting surface, wherein the second cover plate is able to bend.

15. The display apparatus according to claim 14, wherein the first mounting surface is further provided with a second assembly groove, the first mounting plate is further provided with a through hole penetrating the first mounting surface and the second mounting surface, and the through hole communicates with the second assembly groove;
    the second main circuit board and the second connection terminal are located in the second assembly groove, and one end of the second flexible circuit board is electrically connected to the second connection terminal through the through hole,
    wherein the second main circuit board and the first main circuit board have an integrated structure or are provided independently of each other.

16. The display apparatus according to claim 2, further comprising:
    a first middle frame, comprising a first mounting plate and a first side plate, wherein the first mounting plate has a first mounting surface and a second mounting surface opposite to each other, the first side plate is arranged at periphery of the first mounting surface and forms a first mounting groove with the first mounting surface, wherein the first display panel, the first flexible circuit board and the rigid membrane are located in the first mounting groove, and the first part is located on a side of the second part away from the first mounting surface;
    a first main circuit board, provided on the first mounting surface, wherein a first connection terminal is provided on the first main circuit board, and the first connection terminal is electrically connected to the second part;
    a first cover plate, provided on a display side of the first display panel, wherein an edge of the first cover plate is beyond an edge of the first display panel, and a part of the first cover plate beyond the first display panel is overlapped on an end surface of the first side plate away from the first mounting surface.

17. The display apparatus according to claim 3, further comprising:
    a first middle frame, comprising a first mounting plate and a first side plate, wherein the first mounting plate has a first mounting surface and a second mounting surface opposite to each other, the first side plate is arranged at periphery of the first mounting surface and forms a first mounting groove with the first mounting surface, wherein the first display panel, the first flexible circuit board and the rigid membrane are located in the first mounting groove, and the first part is located on a side of the second part away from the first mounting surface;
    a first main circuit board, provided on the first mounting surface, wherein a first connection terminal is provided on the first main circuit board, and the first connection terminal is electrically connected to the second part;
    a first cover plate, provided on a display side of the first display panel, wherein an edge of the first cover plate is beyond an edge of the first display panel, and a part of the first cover plate beyond the first display panel is overlapped on an end surface of the first side plate away from the first mounting surface.

18. The display apparatus according to claim 4, further comprising:
    a first middle frame, comprising a first mounting plate and a first side plate, wherein the first mounting plate has a first mounting surface and a second mounting surface opposite to each other, the first side plate is arranged at periphery of the first mounting surface and forms a first mounting groove with the first mounting surface, wherein the first display panel, the first flexible circuit board and the rigid membrane are located in the first mounting groove, and the first part is located on a side of the second part away from the first mounting surface;
    a first main circuit board, provided on the first mounting surface, wherein a first connection terminal is provided on the first main circuit board, and the first connection terminal is electrically connected to the second part;
    a first cover plate, provided on a display side of the first display panel, wherein an edge of the first cover plate is beyond an edge of the first display panel, and a part of the first cover plate beyond the first display panel is overlapped on an end surface of the first side plate away from the first mounting surface.

19. The display apparatus according to claim 5, further comprising:
    a first middle frame, comprising a first mounting plate and a first side plate, wherein the first mounting plate has a first mounting surface and a second mounting surface opposite to each other, the first side plate is arranged at periphery of the first mounting surface and forms a first mounting groove with the first mounting surface, wherein the first display panel, the first flexible circuit board and the rigid membrane are located in the first mounting groove, and the first part is located on a side of the second part away from the first mounting surface;
    a first main circuit board, provided on the first mounting surface, wherein a first connection terminal is provided on the first main circuit board, and the first connection terminal is electrically connected to the second part;
    a first cover plate, provided on a display side of the first display panel, wherein an edge of the first cover plate is beyond an edge of the first display panel, and a part of the first cover plate beyond the first display panel is overlapped on an end surface of the first side plate away from the first mounting surface.

20. The display apparatus according to claim 6, further comprising:
- a first middle frame, comprising a first mounting plate and a first side plate, wherein the first mounting plate has a first mounting surface and a second mounting surface opposite to each other, the first side plate is arranged at periphery of the first mounting surface and forms a first mounting groove with the first mounting surface, wherein the first display panel, the first flexible circuit board and the rigid membrane are located in the first mounting groove, and the first part is located on a side of the second part away from the first mounting surface;
- a first main circuit board, provided on the first mounting surface, wherein a first connection terminal is provided on the first main circuit board, and the first connection terminal is electrically connected to the second part;
- a first cover plate, provided on a display side of the first display panel, wherein an edge of the first cover plate is beyond an edge of the first display panel, and a part of the first cover plate beyond the first display panel is overlapped on an end surface of the first side plate away from the first mounting surface.

\* \* \* \* \*